(12) United States Patent
Umetsu (10) Patent No.: US 7,518,294 B2
(45) Date of Patent: Apr. 14, 2009

(54) MANUFACTURING METHOD OF QUARTZ CRYSTAL RESONATOR, APPARATUS THEREFOR, AND QUARTZ CRYSTAL RESONATOR MANUFACTURED THEREBY

(75) Inventor: Kazushige Umetsu, Chino (JP)

(73) Assignee: Seiko Epson Corporation (JP)

( * ) Notice: Subject to any disclaimer, the term of this patent is extended or adjusted under 35 U.S.C. 154(b) by 881 days.

(21) Appl. No.: 11/126,983

(22) Filed: May 11, 2005

(65) Prior Publication Data

US 2005/0258146 A1 Nov. 24, 2005

(30) Foreign Application Priority Data

May 21, 2004 (JP) ............................. 2004-151475
Jan. 5, 2005 (JP) ............................. 2005-000411

(51) Int. Cl.
*H01L 41/08* (2006.01)
*H01L 41/22* (2006.01)
*H04R 17/00* (2006.01)

(52) U.S. Cl. ...................................... 310/361; 29/25.35
(58) Field of Classification Search ................ 310/361, 310/367, 368; 29/25.35
See application file for complete search history.

(56) References Cited

U.S. PATENT DOCUMENTS

| 4,661,201 | A | 4/1987 | Petridis et al. | |
|---|---|---|---|---|
| 5,661,744 | A | 8/1997 | Murakami et al. | |
| 6,063,301 | A | 5/2000 | Kiwada et al. | |
| 6,191,524 | B1 | 2/2001 | Sasaki et al. | |
| 2002/0144976 | A1* | 10/2002 | Kwon ........................ | 216/66 |
| 2003/0197566 | A1* | 10/2003 | Kawashima ................ | 331/156 |
| 2005/0236381 | A1* | 10/2005 | Nomaru ................ | 219/121.74 |
| 2006/0110604 | A1* | 5/2006 | Mizuguchi et al. .......... | 428/426 |
| 2007/0176702 | A1* | 8/2007 | Takizawa et al. ............ | 331/158 |
| 2008/0023437 | A1* | 1/2008 | Hirano ........................ | 216/13 |

FOREIGN PATENT DOCUMENTS

CN 1122737 5/1996

(Continued)

OTHER PUBLICATIONS

Ma Binghe, et al. "Micromachining of Monocrystal Silicon by Excimer Laser Direct Etching", Journal of Northwestern Polytechnical University, Aug. 2000, vol. 18, Nov. 3 (pp. 491-495)—translation included.

(Continued)

*Primary Examiner*—Thomas M Dougherty
(74) *Attorney, Agent, or Firm*—Harness, Dickey & Pierce, P.L.C.

(57) ABSTRACT

By applying a laser beam that is absorbed into a quartz crystal to an upper right end of a crystal chip, the height of the crystal chip is altered step by step to form a first step, a second step, a third step, and a fourth step, respectively. As such, control of the shape of a quartz crystal resonator is easy even if the quartz crystal resonator is miniaturized, the shape and the performance of a processed quartz crystal resonator are satisfactory, quartz crystal resonators of various shapes can be formed, a quartz crystal resonator can be formed at low cost with a small number of man-hours, a load in driving a quartz crystal resonator is small, and versatile equipment and tools can be used.

11 Claims, 4 Drawing Sheets

FOREIGN PATENT DOCUMENTS

| | | |
|---|---|---|
| JP | 62-112385 | 5/1987 |
| JP | 08-084040 | 3/1996 |
| JP | 10-130096 | 5/1998 |
| JP | 10-308645 | 11/1998 |
| JP | 11-109117 | 4/1999 |
| JP | 11-298278 | 10/1999 |
| JP | 11-355094 | 12/1999 |
| JP | 2000-286657 | 10/2000 |
| JP | 2000-301447 | 10/2000 |
| JP | 2000-317782 | 11/2000 |
| JP | 2003-037463 | 2/2003 |
| JP | 2003-060481 | 2/2003 |
| JP | 2003-313091 | 11/2003 |

OTHER PUBLICATIONS

Communication from Japanese Patent Office regarding counterpart application.

* cited by examiner

MANUFACTURING METHOD OF QUARTZ CRYSTAL RESONATOR, APPARATUS THEREFOR, AND QUARTZ CRYSTAL RESONATOR MANUFACTURED THEREBY

RELATED APPLICATIONS

This application claims priority to Japanese Patent Application Nos. 2004-151475 filed May 21, 2004 and 2005-000411 filed Jan. 5, 2005 which are hereby expressly incorporated by reference herein in their entirety.

BACKGROUND

1. Technical Field

The present invention relates to a manufacturing method of a quartz crystal resonator for manufacturing an AT cut quartz crystal resonator having a convex sectional shape by processing a crystal chip, an apparatus for the method, and a quartz crystal resonator manufactured by this manufacturing method or this manufacturing apparatus.

2. Related Art

In a conventional method for manufacturing a piezoelectric resonator, blasting is applied to either or both of an AT cut quartz crystal wafer by spraying fine abrasives from a nozzle with a small bore onto desired narrow ranges at both sides along visible outlines of a piezoelectric element piece, thereby manufacturing a piezoelectric element piece having a convex sectional shape (for example, refer to Japanese Unexamined Patent Publication No. 2003-37463 (page 1, [0019] to [0024], FIGS. 1 to 4)). Hereinafter this technique is referred to as a first conventional example.

A conventional manufacturing device of a piezoelectric element plate is a device for manufacturing a piezoelectric element plate having at least one surface with a convex-shaped portion, the manufacturing device comprising: a base for holding a large element plate having a plurality of element plate chips that have still not been separated; and a plurality of polishing members descending and ascending and rotating on or above the top surface of the large element plate held on the base; wherein the plurality of polishing members, which are cylindrical, are provided to correspond one-to-one to element plate chips, each polishing member having a concave polishing surface at its bottom. Each polishing member touches the top surface of each element plate chip and polishes a surface of the element plate chip while rotating and descending, thereby processing the top surfaces of element plate chips to be convex-shaped (for example, refer to Japanese Unexamined Patent Publication No. H11-298278 (page 1, claim 1, [0005] to [0007], FIGS. 1 and 2)). Hereinafter this technique is referred to as a second conventional example.

A conventional method for manufacturing a quartz crystal resonator forms thick and large electrodes on the two main surfaces of a AT cut crystal element plate, which is a flat plate, and then sharpens these electrodes by laser trimming, and therefore creates a stair-like and angled structure in which an area becomes concentrically or spirally narrower as heading the top, thereby forming the whole shape of the quartz crystal resonator to be convex (for example, refer to Japanese Unexamined Patent Publication No. H10-308645 (page 1, claim 4, [0005] and [0008], FIG. 4)). Hereinafter this technique is referred to as a third conventional example.

A conventional method for manufacturing a piezoelectric vibration element comprises a cutting process of cutting down a piezoelectric crystal at an arbitrary angle, a piezoelectric device element formation process of processing the cut piezoelectric crystal into a piezoelectric device element of an arbitrary size, convex lens shape processing process of processing at least after the cutting process the entire or part of one main surface to be in a convex lens shape, a protective film formation process of forming a protective film on at least a main surface of a convex lens shape, and etching process of processing the element, except the protective film formation portion where the protective film is formed (for example, refer to Japanese Unexamined Patent Publication No. 2003-60481 (page 1, claim 9, [0026] to [0029], FIG. 7)). Hereinafter this technique is referred to as a fourth conventional example.

In a conventional method for manufacturing a quartz crystal resonator, a laser beam is applied to the polished crystal wafer, thereby processing this crystal wafer such that its thickness is thin and uniform. Oscillation frequency is measured for each minute portion of the entire surface of the processed crystal wafer using a large number of measuring microelectrodes located in a grid pattern on a glass substrate. Based on the measured results, a laser beam is applied to the portions of the crystal wafer that are thicker than a predetermined thickness to modify the thickness of the portions. Then, after forming a large number of electrodes in a predetermined size on the entire surface of the crystal wafer at predetermined intervals, quartz crystal resonators, which are chips with electrodes, are manufactured by dicing each electrode portion of the crystal wafer (for example, refer to Japanese Unexamined Patent Publication No. 2000-286657 (claim 1, [0005] and [0010] to [0013], FIGS. 1, 2, 4 and 5)). Hereinafter this technique is referred to as a fifth conventional example.

In a conventional method for processing a piezoelectric element, a ring-shaped, quadrangular, or other shaped groove or step is formed on the top surface of a first auxiliary tool, and a second auxiliary tool, which is cylindrical or other shaped and is slightly higher than the groove or step, is fitted to the groove or step. A disk shaped or other shaped piezoelectric element to be polished, which has a height equal to or slightly lower or higher than that of the portion of the second auxiliary tool that is protruding from the top surface of the first auxiliary tool, is installed. An extremely thin workpiece is polished using two wrapping plates, the upper wrapping plate on the top surface of the piezoelectric element to be polished and the lower wrapping plate under the first auxiliary tool (for example, refer to Japanese Unexamined Patent Publication No. 2000-317782 (claim 1, [0005] and [0009] to [0013], FIGS. 1 and 2)). Hereinafter this technique is referred to as a sixth conventional example.

As a conventional method for processing a quartz crystal resonator, there is an example of mixing a crystal chip with abrasives, putting the mixture into a container, which is referred to as a barrel, rotating the container, and bringing the crystal chip inside the container into contact with abrasives and the wall surface of the container by the rotational movement, thereby convex processing the crystal chip. Hereafter this technique is referred to as a seventh conventional example.

The above described first conventional example has problems that controlling its shape becomes difficult as an AT cut quartz crystal resonator is miniaturized and roughness of a surface of an AT cut quartz crystal wafer and a degenerated layer occur due to the use of blasting, which sprays fine abrasives to break an AT cut quartz crystal wafer. The above described second conventional example also has, in addition to the same problems as mentioned for the first conventional example, a problem that the example can be applied just to the disk shaped AT cut quartz crystal resonators and therefore the versatility is low. In the above described third conventional example, there are problems that the formation of an electrode having a stair-like and angled structure takes a large number of man-hours, causing a rise in cost, and the whole electrode becomes thick, increasing the load in driving an AT cut quartz crystal resonator.

The above described fourth conventional example has a problem that a sufficient performance cannot be obtained because a convex shape can be formed just on one side of the crystal chip. In the above described fifth and sixth conventional examples, there is a problem that special equipment and tools are required for processing an AT cut quartz crystal wafer, thereby causing a rise in cost of an AT cut quartz crystal resonator. The above described seventh conventional example has problems of an extremely long processing time (it may be counted by the hundreds), inferior controllability of shape, and the difficulty in processing a small quartz crystal piece.

The present invention aims to solve the above described problems and is intended to obtain a method for manufacturing a quartz crystal resonator, an apparatus for the method, and a quartz crystal resonator manufactured by the method or the apparatus, whereby control of the shape of a quartz crystal resonator is easy even if the quartz crystal resonator is miniaturized, the shape and the performance of a processed quartz crystal resonator are satisfactory, quartz crystal resonators of various shapes can be formed, a quartz crystal resonator can be formed at low cost with a small number of man-hours, a load in driving a quartz crystal resonator is small, and versatile equipment and tools can be used.

SUMMARY

A method for manufacturing a quartz crystal resonator according to the present invention is altering the height of a crystal chip step by step by applying a laser beam that is absorbed into a quartz crystal to an end of the crystal chip. The present invention makes it easy to control the shape of a quartz crystal resonator even if the quartz crystal resonator is miniaturized, makes the shape and the performance of a processed quartz crystal resonator satisfactory, can form quartz crystal resonators of various shapes, can form a quartz crystal resonator at low cost with a small number of man-hours, has a small load in driving a quartz crystal resonator, and can use versatile equipment and tools.

In the above described method, the laser beam is applied with the same intensity to the end of the crystal chip. Thus a laser oscillator that oscillates and emits a laser beam with non-uniform intensity can be used.

Also, in the above described method, the crystal chip is a rectangular solid and the radiation pattern of the laser beam is rectangular. Thus a quartz crystal resonator having a convex sectional shape can be manufactured from a crystal chip that is a rectangular solid.

In the above described method, a laser beam is applied to an end of a crystal chip through a mask with a transmission section in which a circular arc side is formed such that the transmission section is concave at the center side of the crystal chip. Thus a quartz crystal resonator having a sectional shape that is more similar to a convex shape can be manufactured.

Also, in the above described method, the quartz crystal resonator to which a laser beam has applied is immersed in a corrosive liquid. Thus the processing dust that is adherent to the surface of a quartz crystal resonator by application of the laser beam is removed and therefore the performance of a quartz crystal resonator improves. The corrosive liquid is hydrofluoric acid, ammonium fluoride, buffered hydrogen fluoride, Max7011G, ammonium bifluoride, or an alkaline liquid at least including potassium hydroxide.

An apparatus for manufacturing a quartz crystal resonator according to the present invention comprises a laser oscillator for emitting a laser beam that is absorbed inside a crystal chip and a movement mechanism for moving the laser oscillator for a predetermined pitch, wherein the laser beam is applied to an end of the crystal chip while the movement mechanism moves the laser oscillator from the vicinity of the end towards the end for a predetermined pitch such that a step section having a plurality of steps are formed. The present invention makes it easy to control the shape of a quartz crystal resonator even if the quartz crystal resonator is miniaturized, makes the shape and the performance of a processed quartz crystal resonator satisfactory, can form quartz crystal resonators of various shapes, can form a quartz crystal resonator at low cost with a small number of man-hours, has a small load in driving a quartz crystal resonator, and can use versatile equipment and tools.

An apparatus for manufacturing a quartz crystal resonator according to the present invention comprises a laser oscillator for emitting a laser beam that is absorbed into a quartz crystal, a movement mechanism for moving a crystal chip for a predetermined pitch, wherein a laser beam is applied to an end of the crystal chip while the movement mechanism moves the crystal chip for a predetermined pitch such that the height of the crystal chip is altered step by step. The present invention makes it easy to control the shape of a quartz crystal resonator even if the quartz crystal resonator is miniaturized, makes the shape and the performance of a processed quartz crystal resonator satisfactory, can form quartz crystal resonators of various shapes, can form a quartz crystal resonator at low cost with a small number of man-hours, has a small load in driving a quartz crystal resonator, and can use versatile equipment and tools.

A quartz crystal resonator according to the present invention is manufactured by any one of the methods for manufacturing a quartz crystal resonator. The present invention can sufficiently satisfy the current demand towards a high performance and miniature quartz crystal resonator, which is indispensable for miniaturizing various types of mobile devices.

A quartz crystal resonator according to the present invention is manufactured by any one of the apparatuses for manufacturing a quartz crystal resonator. The present invention can sufficiently satisfy the current demand towards a high performance and miniature quartz crystal resonator, which is indispensable for miniaturizing various types of mobile devices.

DETAILED DESCRIPTION

First Embodiment

Figure 1:
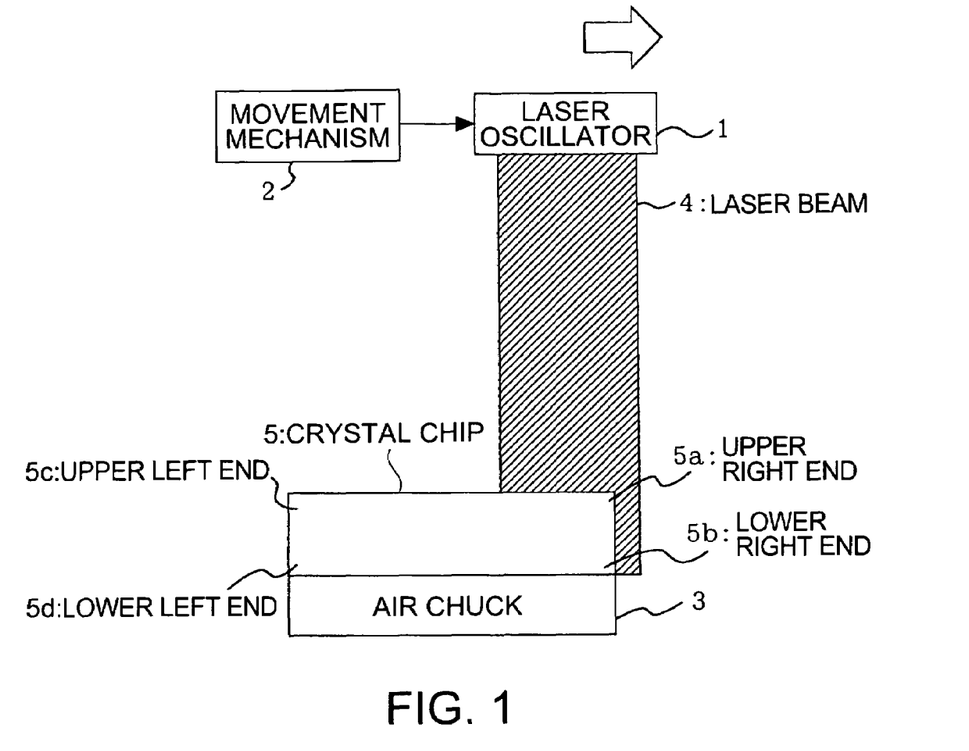
FIG. 1 is a schematic diagram of an apparatus for manufacturing a quartz crystal resonator, showing a first embodiment of the present invention.
Figure 2:
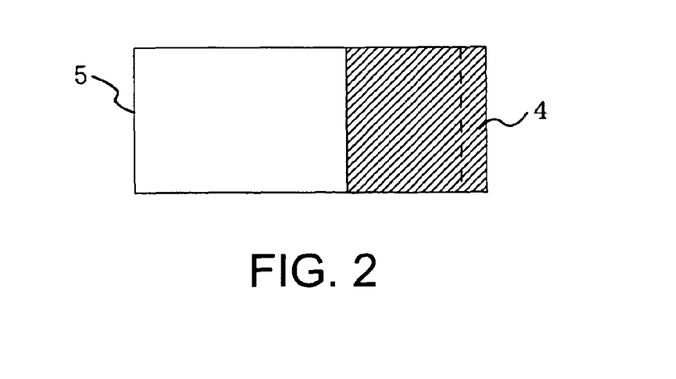
FIG. 2 is a plan view for illustrating a radiation pattern of a laser beam.

FIG. 1 is a schematic diagram showing a structure of an apparatus for manufacturing a quartz crystal resonator that is a first embodiment of the present invention. The apparatus for manufacturing a quartz crystal resonator in this example generally comprises a laser oscillator 1, a movement mechanism 2, and an air chuck 3. The laser oscillator 1 is, for example, a $F_2$ laser (fluorine) and oscillates to emit a laser beam 4 having 157 nm wavelength and uniform intensity distribution. The radiation pattern of the laser beam 4 is rectangular as shown in FIG. 2. The reason of employing the $F_2$ laser in this example is that a laser beam emitted from the $F_2$ laser is absorbed into a crystal chip 5 that is a transparent material thereby enabling processing. Accordingly, a laser that emits a laser beam to be absorbed into the crystal chip 5, thereby enabling processing, is accepted as the laser oscillator 1. As another laser than the $F_2$ laser, for example, an ultra short light pulse laser that causes multiple photon absorption of a laser beam inside the crystal chip 5 may be used. The movement mechanism 2 moves the laser oscillator 1 for a predetermined pitch in the direction indicated by the arrow in the drawing. The air chuck 3 absorbs and fixes crystal chip 5 by reducing the internal pressure.

Figure 3A:
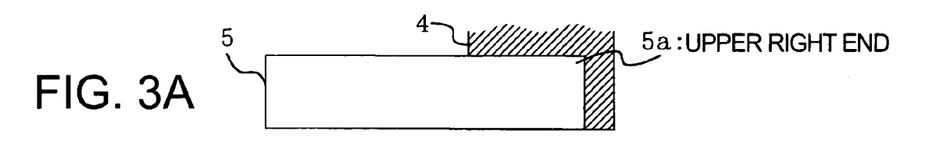
FIGS. 3A to 3H are manufacturing process diagrams of a quartz crystal resonator in a first embodiment.
Figure 3B:
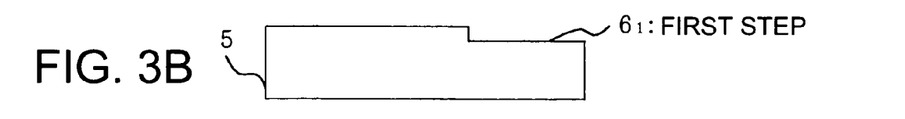

A method for manufacturing a quartz crystal resonator that uses the manufacturing apparatus of a quartz crystal resonator having the above described structure will be described with reference to FIG. 3. Note that, as will be apparent from comparison between FIGS. 4A and 3H, FIGS. 3A though 3H show the manufacturing processes of one fourth of the quartz crystal resonator 11, namely the upper right portion. As shown in FIG. 1, the crystal chip 5, which is an approximately a solid, is fixed to the top surface of the air chuck 3. Then, as shown in FIG. 3A, the laser beam 4 is applied to an upper right end 5a of the crystal chip 5 for a predetermined time (first shot). Thus, as shown in FIG. 3B, a portion of the upper right end 5a of the crystal chip 5 is removed to form a first step $6_1$ of a predetermined height.

Figure 3C:
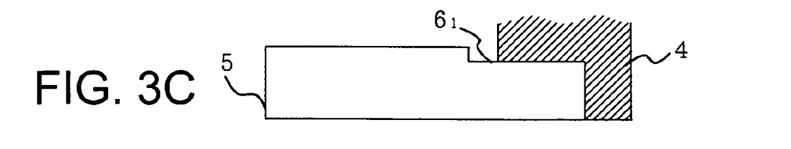
Figure 3D:
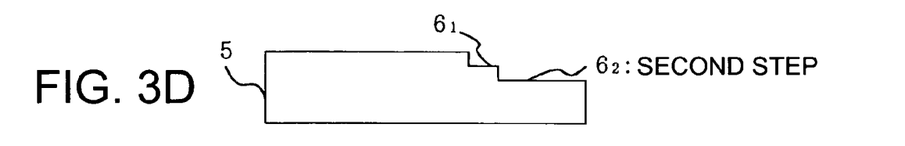
Figure 3E:
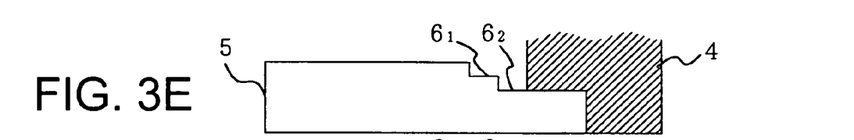
Figure 3F:
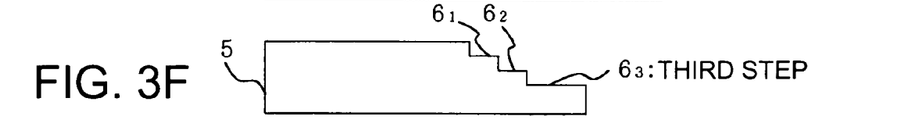
Figure 3G:
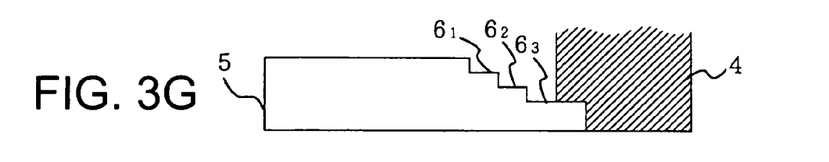
Figure 3H:
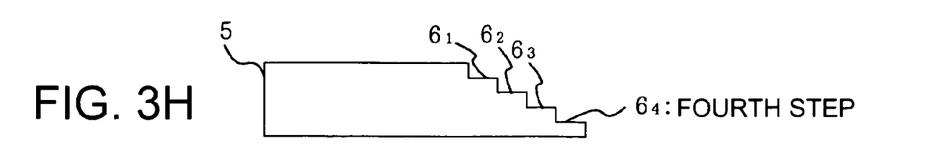

After the laser oscillator 1 is moved for just one pitch in the arrow direction shown in FIG. 1 by using the movement mechanism 2, the laser beam 4 is applied to the upper right end 5a of the crystal chip 5 for a predetermined time, as shown in FIG. 3C (second shot). Thus, as shown in FIG. 3D, a portion of the upper right end 5a of the crystal chip 5 is removed to form a second step $6_2$ of a predetermined height. Then, the movement of the laser oscillator 1 by the movement mechanism 2 and the application of the laser beam 4 are similarly repeated (third and fourth shots, refer to FIGS. 3E to 3G), so that, as shown in FIG. 3H, portions of the upper right end 5a of the crystal chip 5 are subsequently removed to subsequently form a third step $6_3$ and a fourth step $6_4$ of predetermined heights.

After the crystal chip 5 having the first step $6_1$ to fourth step $6_4$ formed in the upper right end 5a is once removed from the top surface of the air chuck 3, the crystal chip 5 is turned 180 degrees in the horizontal direction so as to locate an upper left end 5c under the laser oscillator 1, and is fixed to the top surface of the air chuck 3. Then, by the processes similar to the ones above described with reference to FIGS. 3A through 3H, the first to fourth steps of predetermined heights, not shown, are formed in the upper left end 5c of the crystal chip 5.

Figure 4A:
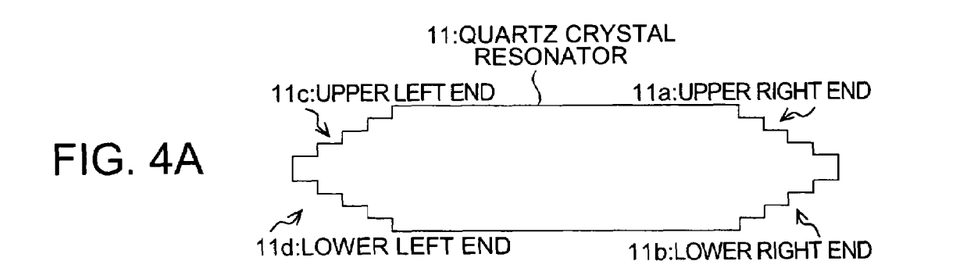
FIGS. 4A and 4B are a sectional view and a plan view of a quartz crystal resonator, respectively.
Figure 4B:
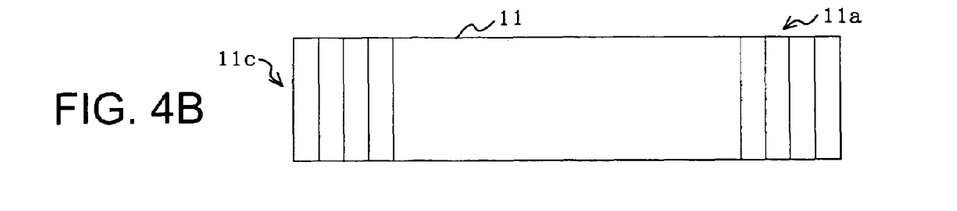

After the crystal chip 5 having the first to fourth steps formed in each of the upper right end 5a and upper left end 5c is once removed from the top surface of the air chuck 3, the crystal chip 5 is turned 180 degrees in the vertical direction so as to locate a lower left end 5d under the laser oscillator 1, and is fixed to the top surface of the air chuck 3. Then, by the processes similar to the ones above described with reference to FIGS. 3A through 3H, the first to fourth steps of predetermined heights, not shown, are formed in the lower left end 5d of the crystal chip 5. Then, after the crystal chip 5 having the first to fourth steps formed in each of the upper right end 5a, upper left end 5c, and lower left end 5d is once removed from the top surface of the air chuck 3, the crystal chip 5 is turned 180 degrees in the horizontal direction so as to locate the lower right end 5b under the laser oscillator 1, and is fixed to the top surface of the air chuck 3. Then, by the processes similar to the ones above described with reference to FIGS. 3A through 3H the first to fourth steps of predetermined heights, not shown, are formed in the lower right end 5b of the crystal chip 5, thereby forming the quartz crystal resonator 11 that has the first to fourth steps of predetermined heights in each of an upper right end 11a, a lower right end 11b, an upper left end 11c, and a lower left end 11d, as shown in FIGS. 4A and 4B. In general terms, the first to fourth steps are referred to as a step section hereinafter.

FIG. 4A is a sectional view of the quartz crystal resonator 11, and FIG. 4B is a plan view of the quartz crystal resonator 11. In the above description, in order to make the description clearly understandable, the example of forming only the first to fourth steps of predetermined heights in each of the upper right end 5a, upper left end 5c and lower left end 5d is indicated The laser oscillator 1, however, actually emits the laser beam 4 around 200 shots per second to permit formation of more steps, and therefore can manufacture an AT cut quartz crystal resonator having a more smooth convex sectional shape than that shown in FIGS. 4A and 4B. The manufacturing time of the quartz crystal resonator is several seconds. This manufacturing time depends on the power of the laser beam 4.

Since processing dust sometimes sticks to a surface of the quartz crystal resonator 11 by the above described application of the laser beam 4, the quartz crystal resonator 11 is immersed in hydrofluoric acid (HF), for example, to remove the processing dust, as necessary. Thus, the processing dust is removed, resulting in improvement of the performance of the quartz crystal resonator. The oscillation frequency of a manufactured AT cut quartz crystal resonator having a convex sectional shape ranges around 10 MHz to about 100 MHz. Ammonium fluoride, buffered hydrogen fluoride, Max7011G, ammonium bifluoride, or an alkaline liquid including at least potassium hydroxide, for example, may be used instead of the above hydrofluoric acid (HF).

Thus, according to the structure of this example, the step section comprising a plurality of steps are formed in each of the upper right end 5a, lower right end 5b, upper left end 5c, and lower left end 5d of the crystal chip 5 by using the laser beam 4 that has absorbability for quartz crystals. Accordingly, controlling the shape of a quartz crystal resonator is easy if the quartz crystal resonator is miniaturized, and roughness of a surface of an AT cut crystal chip and a degenerated layer are unlikely to occur. According to the structure of this example, a radiation pattern, a scanning method, or irradiation timing of the laser beam can be arbitrarily changed, and therefore not only the quartz crystal resonator shown in FIGS. 4A and 4B, which is in the shape of an approximately rectangular solid as a whole and is convex-shaped in section, but also quartz crystal resonators having a disk shape or other various shapes can be manufactured.

Moreover, according to the structure of this example, the laser oscillator 1 that emits the laser beam 4 around 200 shots per second is used, and therefore the quartz crystal resonator can be manufactured in a small number of man-hours, resulting in reduction of costs, while the load in driving the quartz crystal resonator never increases because the shape of the electrode is not different from the conventional one. According to the structure of this example, convex shapes can also be formed on both sides of the crystal chip to obtain a sufficient performance. It is not necessary in the structure of this example to use special equipment and tools for processing the AT cut crystal chip 5, and therefore the costs of the quartz crystal resonator can be reduced. As a result, the current demand towards a high performance and miniature quartz crystal resonator, which is indispensable for miniaturizing various types of mobile devices, can be sufficiently satisfied.

Second Embodiment

Figure 5:
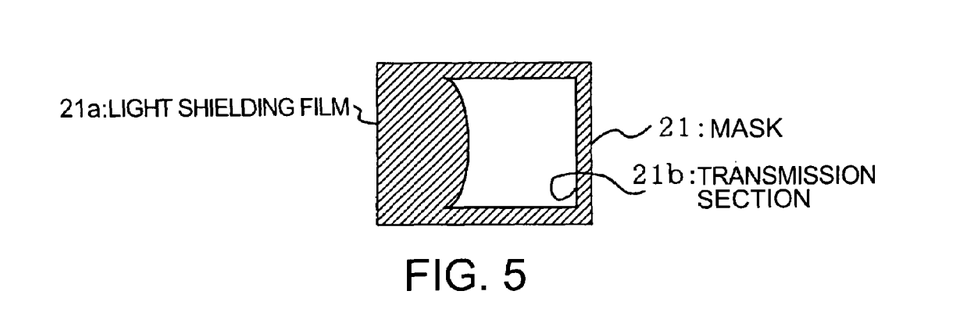
FIG. 5 is a plan view of a mask used in a method for manufacturing a quartz crystal resonator, showing a second embodiment.

FIG. 5 is a plan view of a mask 21 used in a manufacturing apparatus of a quartz crystal resonator that is a second embodiment of the present invention. The structure of the apparatus, except the mask 21, is the same as that shown in FIG. 1. The mask 21, as shown in FIG. 5, has an approximately shape with the width slightly larger than that of the crystal chip 5 to be processed and the length that is around half the length of the crystal chip 5. In the mask 21, a light shielding film 21a that contains a transmission section 21b with four sides is formed on a glass plate. Three sides of the transmission section 21b that are adjacent one another are made of straight lines. The remaining one side, namely the side that is located on the center side of the crystal chip 5 when the mask is placed on the crystal chip 5, has a circular arc shape such that the transmission section 21b is concave at the center side of the crystal chip 5. The light shielding film 21a is made of tungsten (W), aluminum (Al), chromium (Cr), or the like, and shields the laser beam 4 in other portions than the transmission section 21b.

Figure 6:
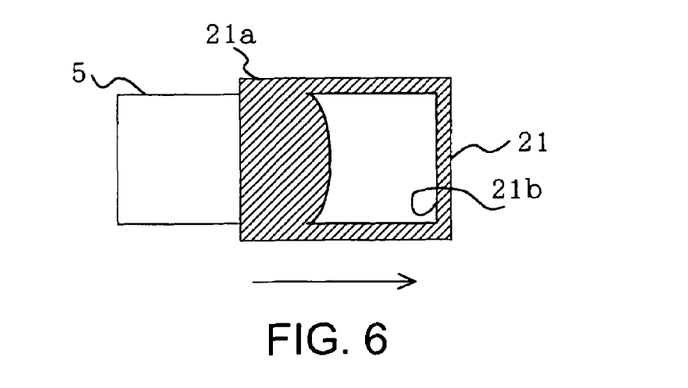
FIG. 6 is a conceptual diagram for illustrating a method for manufacturing a quartz crystal resonator in a second embodiment.

Next, the method for manufacturing a quartz crystal resonator using the manufacturing apparatus of a quartz crystal resonator of the above described structure will be described. As shown in FIG. 1, the crystal chip 5, which is an approximately angular solid, is fixed to the top surface of the air chuck 3, and then, as shown in FIG. 6, the mask 21 is placed on the top surface of the upper right end 5a of the crystal chip 5. In this state, the laser beam 4 is applied to the upper right end 5a of the crystal chip 5 for a predetermined time (first shot). Thus, as shown by solid line in FIG. 7, a portion of the upper right end 5a of the crystal chip 5 is removed to form a first step $31_1$ of a predetermined height.

After the laser oscillator 1 is moved for just one pitch in the arrow direction shown in FIG. 1 by using the movement mechanism 2 and also the mask 21 is moved for just one pitch in the arrow direction shown in FIG. 6 in synchronization with the laser oscillator 1, the laser beam 4 is applied to the upper right end 5a of the crystal chip 5 for a predetermined time (second shot). Thus, as shown by solid line in FIG. 7, a portion of the upper right end 5a of the crystal chip 5 is removed to form a second step $31_2$ of a predetermined height.

Figure 7:
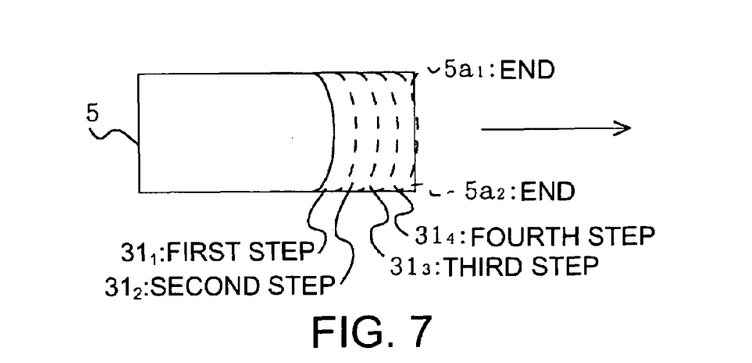
FIG. 7 is a conceptual diagram for illustrating a method for manufacturing a quartz crystal resonator in a second embodiment.

Then, the movement of the laser oscillator 1 by the movement mechanism 2, the movement of the mask 21 in synchronization with the laser oscillator 1, and the application of the laser beam 4 are similarly repeated (third and fourth shots), so that, as shown in FIG. 7, portions of the upper right end 5a of the crystal chip 5 are subsequently removed to subsequently form a third step $31_3$ and a fourth step $31_4$ of predetermined heights. Ends $5a_1$ and $5a_2$ of the crystal chip 5 shown in FIG. 7 are processed most deeply to become spherical because the number of applications of the laser beam 4 (the number of shots) to them is more than that to other portions. The subsequent procedures of the manufacturing method, with the exception of setting the lower right end 5b, upper left end 5c, and lower left end 5d of the crystal chip 5 as locations for processing, are found in the above descriptions, and therefore overlapping explanations will not be repeated.

Thus, according to the structure of this example, the crystal chip 5 is processed by using the mask 21 having one side of a circular arc shape, and therefore, in addition to the above described effect obtained in the first embodiment, the effect of being able to manufacture an AT cut quartz crystal resonator having a sectional shape that is more similar to convex can be obtained.

Third Embodiment

Each of the above embodiments shows the example of fixing the crystal chip 5 and moving the side of the laser oscillator 1 or the side of the laser oscillator 1 and the mask 21, but the present invention is not restricted to this example. For example, an embodiment may be structured such that the side of the laser oscillator 1 is fixed while the crystal chip 5 or the side of the crystal chip 5 on which the mask 21 is placed is moved in the opposite direction to the arrow direction shown in FIG. 1 by an XY stage or the like.

Fourth Embodiment

Figure 8:
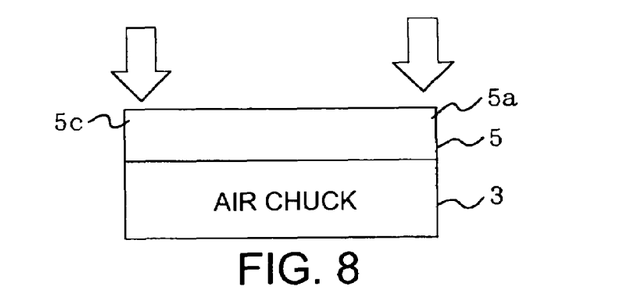
FIG. 8 is a conceptual diagram for illustrating the first example of the method for manufacturing a quartz crystal resonator in a fourth embodiment.
Figure 9:
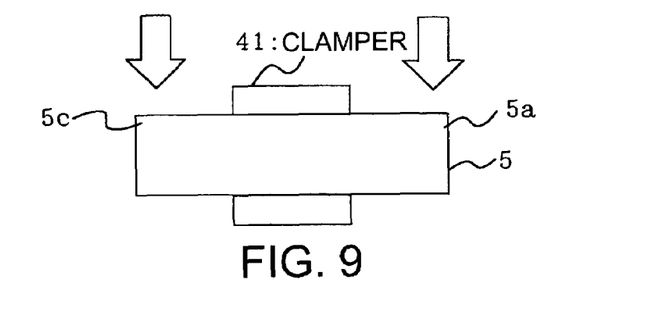
FIG. 9 is a conceptual diagram for illustrating the second example of the method for manufacturing a quartz crystal resonator in a fourth embodiment.
Figure 10:
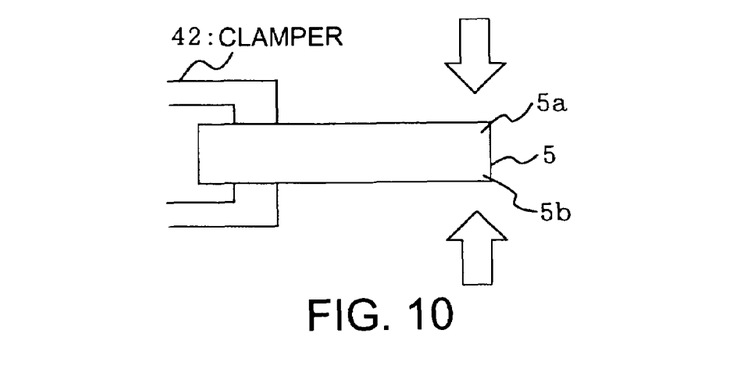
FIG. 10 is a conceptual diagram for illustrating the third example of the method for manufacturing a quartz crystal resonator in a fourth embodiment.

Each of the above embodiments shows the example of forming a plurality of steps for each of four ends of the crystal chip 5 having an approximately an solid shape, but the present invention is not restricted to this example. For example, as shown in FIG. 8, by applying laser beams to both the upper right end 5a and the upper left end 5c of the crystal chip 5 fixed to the top surface of the air chuck 3 as indicated by the two arrows in the drawing, a plurality of steps may be formed simultaneously in each end. As shown in FIG. 9, with approximately the center of the crystal chip 5 held vertically by a clamper 41, applying laser beams to both the upper right end 5a and the upper left end 5c of the crystal chip 5 as indicated by the two arrows in the drawing may form a plurality of steps may simultaneously in each end. Such a structure can reduce the processing time to less than half.

Fifth Embodiment

Each of the above embodiments shows the example of using the laser oscillator 1 that oscillates and emits the laser beam 4 with uniform intensity distribution, but the present invention is not restricted to this example. When a laser oscillator that oscillates and emits a laser beam with non-uniform intensity distribution is used, the use of an element that uniforms a wavefront of the laser beam such as a phase grating, a diffraction grating, a stepper for light exposure used in manufacturing a semiconductor device or the like, a beam homogenizer, or a Fresnel lens is satisfactory.

Sixth Embodiment

Each of the above embodiments shows the example of applying this invention to manufacturing of a quartz crystal resonator, but the present invention is not restricted to this example. This invention can be applied to the cases of manufacturing various types of micro electric mechanical systems (EMS) devices such as microchannel devices and three-dimensional orifices of inkjet heads by three-dimensional shape processing of the materials that are transparent, have high degrees of purity as well as hardness, and are difficult to be processed such as quartz crystal quartz, and glass.

SEVENTH EMBODIMENT

The above second embodiment shows the example of using the mask 21 made by forming the light shielding film 21*a* having the transmission section 21*b* on the glass plate, but the present invention is not restricted to this example. The mask may be made, for example, by forming an opening in the same shape as that of the transmission section 21*b* in a metal plate made of tungsten (W), aluminum (Al), or chromium (Cr). Such a structure can form a desired convex sectional shape in a quartz crystal resonator, even when the energy of a laser beam is large.

Thus these embodiments have been described with reference to the drawings, but particular structures are not restricted to these embodiments and modifications of design without departing from the scope of the present invention are included in the present invention.

For example, although the example of the rectangular radiation pattern of the laser beam 4 is shown in the above-described first embodiment, the present invention is not restricted to this. Even if a radiation pattern of the laser beam 4 is circular, it is sufficient to use a rectangular mask that permits the radiation pattern shown in FIG. 2 to be applied to the crystal chip 5.

The above described embodiments can mutually utilize their techniques as long as a special contradiction or a special problem is not found in the object, the structure, and the like.

What is claimed is:

1. A method for manufacturing a quartz crystal resonator, the method comprising:
    altering a height of a crystal chip step by step by applying a laser beam that is absorbed into a quartz crystal to the crystal chip, the laser beam being applied step by step from an inboard portion of the crystal chip to an outboard end of the crystal chip.

2. The method for manufacturing a quartz crystal resonator according to claim 1, wherein the laser beam is applied with the same intensity to the end of the crystal chip.

3. The method for manufacturing a quartz crystal resonator according to claim 1, wherein the crystal chip is a rectangular solid and a radiation pattern of the laser beam is rectangular.

4. The method for manufacturing a quartz crystal resonator according to claim 1, wherein the laser beam is applied to the end of the crystal chip through a mask having a transmission section in which a circular arc side is formed such that the transmission section is concave at a center side of the crystal chip.

5. The method for manufacturing a quartz crystal resonator according to claim 1, wherein the quartz crystal resonator to which the user beam has applied is immersed in a corrosive liquid.

6. The method for manufacturing a quartz crystal resonator according to claim 5, wherein the corrosive liquid is at least one of hydrofluoric acid, ammonium fluoride, buffered hydrogen fluoride, Max7011G, ammonium bifluoride, and an alkaline liquid including at least potassium hydroxide.

7. An apparatus for manufacturing a quartz crystal resonator, the apparatus comprising:
    a laser oscillator for emitting a laser beam that is absorbed inside a crystal chip; and
    a movement mechanism for moving the laser oscillator for a certain pitch,
    wherein the laser beam is applied to an end of the crystal chip while the movement mechanism moves the laser oscillator from a vicinity inboard of the end of the crystal chip towards the end for the certain pitch such that a step section having a plurality of steps is formed.

8. An apparatus for manufacturing a quartz crystal resonator, the apparatus comprising:
    a laser oscillator for emitting a laser beam that is absorbed into a quartz crystal; and
    a movement mechanism for moving a crystal chip for a certain pitch,
    wherein the laser beam is applied to an end of the crystal chip while the movement mechanism moves the crystal chip for the certain pitch such that a height of the crystal chip is altered step by step.

9. A quartz crystal resonator which is manufactured by the method for manufacturing a quartz crystal resonator according to claim 1.

10. A quartz crystal resonator which is manufactured by using the apparatus for manufacturing a quartz crystal resonator according to claim 7.

11. A quartz crystal resonator which is manufactured by using the apparatus for manufacturing a quartz crystal resonator according to claim 8.

* * * * *